(12) United States Patent
Bahary (10) Patent No.: US 11,575,389 B2
(45) Date of Patent: Feb. 7, 2023

(54) MULTI-STANDARD LOW-DENSITY PARITY CHECK DECODER

(71) Applicant: NXP USA, Inc., Austin, TX (US)

(72) Inventor: Robert Bahary, Arlington Heights, IL (US)

(73) Assignee: NXP USA, Inc., Austin, TX (US)

( * ) Notice: Subject to any disclaimer, the term of this patent is extended or adjusted under 35 U.S.C. 154(b) by 55 days.

(21) Appl. No.: 17/114,865

(22) Filed: Dec. 8, 2020

(65) Prior Publication Data

US 2022/0182075 A1 Jun. 9, 2022

(51) Int. Cl.
*H03M 13/00* (2006.01)
*H03M 13/11* (2006.01)

(52) U.S. Cl.
CPC ...... *H03M 13/1111* (2013.01); *H03M 13/616* (2013.01)

(58) Field of Classification Search
CPC ............. H03M 13/116; H03M 13/616; H03M 13/1111; H03M 13/1137
See application file for complete search history.

(56) References Cited

U.S. PATENT DOCUMENTS

| | | | | |
|---|---|---|---|---|
| 5,668,548 A * | 9/1997 | Bakhmutsky | ......... | H03M 7/425 375/E7.231 |
| 5,757,295 A * | 5/1998 | Bakhmutsky | .......... | H04N 19/00 341/82 |
| 9,548,759 B1 * | 1/2017 | Rad | .................. | H03M 13/6516 |
| 2005/0283707 A1 * | 12/2005 | Sharon | ............... | H03M 13/1137 714/758 |
| 2008/0028271 A1 * | 1/2008 | Chen | .................... | H03M 13/116 714/752 |
| 2008/0276156 A1 * | 11/2008 | Gunnam | ............ | H03M 13/1105 714/801 |
| 2009/0158121 A1 * | 6/2009 | Oh | ..................... | H03M 13/1137 714/759 |

(Continued)

FOREIGN PATENT DOCUMENTS

WO 2006001015 A2 1/2006
WO 2019191398 A1 10/2019

OTHER PUBLICATIONS

Nimara et al., "FPGA Architecture of Multi-Codeword LDPC Decoder With Efflicient BRAM Utliization," 2016 IEEE 19th Symposium on Design and Diagnostics of Electronic Circuits & Systems (DDECS), Apr. 20-22, 2016; 4 pages.

(Continued)

*Primary Examiner* — Albert Decady
*Assistant Examiner* — Enamul M Kabir (57) ABSTRACT

A wireless receiving device comprises a low-density parity check (LDPC) decoding circuit, comprising a circular shifter constructed and arranged to simultaneously process multiple code words of a parity check matrix configured for different wireless communication standards, including performing a cyclic shift operation of the multiple code words to align with one or more requisite check nodes of a decoder and a logic circuit at an output of the circular shifter constructed and arranged for a matrix larger than the parity check matrix and that includes components having excess hardware due to the construction and arrangement for the larger matrix to decode the multiple code words of the smaller parity check matrix for output to the one or more requisite check nodes.

20 Claims, 8 Drawing Sheets

(56) References Cited

U.S. PATENT DOCUMENTS

| | | | | |
|---|---|---|---|---|
| 2009/0199071 A1* | 8/2009 | Graef | ............... | H03M 13/6325 714/E11.007 |
| 2010/0107030 A1* | 4/2010 | Graef | ................... | H03M 13/116 714/752 |
| 2010/0275088 A1* | 10/2010 | Graef | ............... | H03M 13/1122 714/752 |
| 2015/0067440 A1* | 3/2015 | Owen | ............... | H03M 13/1111 714/758 |
| 2018/0351585 A1* | 12/2018 | Morero | ............... | H03M 13/116 |

OTHER PUBLICATIONS

Shih et al., "An 8.29 mm2 52 mW Multi-Mode LDPC Decoder Design for Mobile WiMAX System in 0.13 um CMOS Process," IEEE Journal of Solid-State Circuits, vol. 43, No. 3, Mar. 2008, pp. 672-683; 12 pages.

Xiang et al., "A 4.84 mm2 847-955 Mb/s 397 mW Dual-Path Fully-Overlapped QC-LDPC Decoder for the WiMAX System in 0.13 um CMOS," 2010 Symposium on VLSI Circuits/Technical Digest of Technical Papers, p. 211-212; 2 pages.

Ericsson, "Design Parameters and Implementation Aspects of LDPC Codes", 3GPP Draft, R1-1703537 Design Parameters and Implementation Aspects of LDPC Codes, 3rd Generation Partnership Project, Feb. 15, 2017, pp. 1-9, vol. RAN WG1, No. Athens Greece, Mobile Competence Center, retrieved from the internet at http://www.3gpp.org/ftp/tsg_ran/WG1_RL1/TSGR1_88/Docs/ on Feb. 15, 2017.

Abburi, Kiran Kumar, "A Scalable LDPC Decoder on GPU", Proceedings of the 24th International Conference on VLSI Design, Jan. 2, 2011, pp. 183-188, IEEE, Piscataway, NJ, USA.

Gunnam et al., "VLSI Architectures for Layered Decoding for Irregular LDPC Codes of WIMax", Proceedings of the 2007 IEEE International Conference on Communications, Jun. 1, 2007, pp. 4542-4547, IEEE, Piscataway, NJ, USA.

\* cited by examiner

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | ...67 |
|---|---|---|---|---|---|---|---|---|---|---|---|---|---|---|---|---|---|---|---|---|---|---|---|---|---|---|---|---|---|
| 0 | 307 | 76 | | 6 | | 328 | 4 | | | 19 | | | | | | 34 | 6 | 78 | | | | 45 | 1 | 0 | | | | | |
| 1 | 22 | 25 | 3 | 16 | 5 | 5 | 8 | 12 | 5 | | | 22 | 34 | 5 | | 454 | | | | | | | 0 | 0 | | 0 | | | |
| 2 | 413 | | 27 | 87 | 9 | | | | | | | 34 | 5 | 31 | | 10 | | | 10 | 12 | 45 | | | | 0 | 0 | | | |
| 3 | 276 | 37 | | 0 | 7 | | 39 | | | 1 | 40 | | 34 | 5 | | 201 | | | | | 304 | | | | | | 0 | | |
| 4 | 332 | 81 | | | | | | | | | | | | | | | | | | | | | | | | | | | |
| 45 | | | | | | | | | | | | | | | | | | | | | | | | | | | | | |

FIG. 9

MULTI-STANDARD LOW-DENSITY PARITY CHECK DECODER

FIELD

The present disclosure relates generally to error correction in data communications, and more particularly to a low-density parity check ("LDPC") decoder that processes codes characterized by a parity check matrix for correcting channel errors, regardless of industrial standard to which the data complies.

BACKGROUND

Modern wireless devices typically include a combination of encoders and decoders that employ various error correcting coding techniques to address noise, interference, or the like associated with a communication channel formed between a transmitter and a receiver. For example, a receiver can apply a decoder to determine whether a received signal was corrupted after transmission and to correct any errors detected. Low density parity check ("LDPC") codes are one of a variety of error correcting codes. However, LDPC encoders and decoders often communicate according to a variety of different industry or technical standards, which requires different hardware for each standard that consumes valuable space on computer chips.

In addition, additional silicon area of a chip is required to accommodate the multiple decoders, in particular, the various processors such as check node updating (CNU) processors and variable node updating (VNU) processors, which operate in parallel to satisfy the ever-increasing system throughput requirements. In doing so, data dependency and RAM access collisions can restrict the number of parallel CNU and VNUs in an LDPC decoder. For example, a CNU processes the rows on the parity check matrix, the results of which are processed by a VNU. Here, a VNU cannot process a particular row and column until the CNU has completed its processing of the entire previous row.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Quasi Cyclic-Low density parity check ("QC-LDPC") codes are a class of error-correcting LDPC codes used in a wide variety of applications, such as digital and/or wireless communications processing, where computer chips comprising 5G and/or other wireless communication processors support some or all current global cellular standards such as 5G or so on. A LDPC decoder typically implements a combination of check node updating (CNU) processors, variable node updating (VNU) processors, and a shared memory fabric used to communicate messages between the VNUs and CNUs. However, it is desirable to increase throughout of an LDPC decoder notwithstanding the physical constraints of a chip, such as number of processors consuming the silicon area of the chip, especially desired in order for the decoder to perform multi-standard LDPC processing.

In brief overview, embodiments of an error correcting decoder architecture can accommodate an increase in data throughput requiring fewer silicon-consuming LDPC codecs comprising a combination of encoders and decoders than conventional techniques that would require a large number of CNUs and VNUs to achieve a same or similar desired throughput. The error correcting decoder architecture reuses data paths, RAM, flip-flop storage, and/or other logic circuits constructed for a large matrix to decode multiple smaller code words of a sub-matrix simultaneously. In some embodiments, an LPDC decoder is an iterative error correcting decoder, which includes a large-scale parallel network of check and variable nodes for processing a largest possible parity check matrix. The LDPC decoder includes hardware components to accommodate this matrix. However, in conventional configurations, inefficiencies arise because some hardware components of the decoder are unused when processing smaller matrices because the decoder is configured to process a largest possible matrix. Some embodiments of the inventive LDPC decoder is more efficient in that it processes multiple code blocks at a time that includes the use of this extra hardware, and can therefore process matrices of various sizes due to compliance with different standards, for example, various different wireless communication standards. Other embodiments include a circular shifter that is constructed and arranged to address any unused data paths in the RAMs by accommodating multiple code words from different matrices or sub-matrices, regardless of standard to which they comply.

In some embodiments, the decoder processes multiple code blocks of a small sub-block LDPC code with hardware components capable for processing a larger single code word sub-block. As previously mentioned, multiple sub-matrices can be processed at a time. In doing so, the results from the CNUs are saved in memory, allowing the VNUs to process any sub-matrix from two or more rows. Accordingly, fewer area-occupying LDPC decoders are required to meet throughput requirements that would otherwise require a larger number of LDPC decoders. Some conventional architectures require doubling the number of CNUs to increase throughout. Some embodiments of the inventive LDPC decoder, on the other hand, doubles the output storage of a CNU but not the data path of a CNU. This feature of processing one sub-matrix at a time but storing extra rows, for example, two rows, of the CNU results (distinguished from CN messages) so that the VNU can process any sub-matrix from the two rows of CNU results and in doing so reduces RAM access contentions and assists with data dependencies. For example, a VNU and CNU may operate on a sub-matrix every clock cycle. In doing so, they require a data input, and a memory location to store their output data. This data is stored in a RAM embedded in the silicon chip. RAMs that use the least silicon area per bit only allow a single read or write access each clock cycle, referred to as single port RAMs. If multiple processing units require access the RAM in the same cycle, then contention may occur. This can be addressed by requiring some of the requesting units wait, but that reduces throughput. To resolve the VNU and CNU contention issue, embodiments of the inventive concepts use a RAM that allows a read and write in the same cycle. This type of RAM is only slightly larger than a single port RAM because it doesn't duplicate the read or the write hardware. The challenge here is that using multiple VNUs and CNUs can worsen the risk of a contention problem because every cycle data is needed for the CNUs and VNUs.

Also, due to the CNU output storage for storing the extra row of the CNU's results, greater flexibility is provided in re-ordering the VNU's operations without the need for duplicate area-consuming CNUs. For example, The CNU finds the 1st and 2nd minimum values across a row. The CNU stores the current minimum for the row as it updates it for each column it processes. After the CNU completes an entire row, it will transfer the minimum values to a saved copy of the minimums. The VNU then uses this saved copy to process the row previously completed by the CNU.

In some embodiments, the foregoing process complies with a set of predetermined rules. Each column must be processed alternately as follows: CNU-VNU-CNU-VNU, and so on. The CNU cannot process the same column again, until the VNU updates it. The CNU and VNU cannot process the same column in the same cycle because there will be RAM contention. The CNU cannot update its saved minimums until the VNU is done using them. The VNU cannot start processing a row until the CNU has completed it. Consider the CNU processing for row 4 shown in FIG. 9. Here, the CNU only has three non-blank entries in that row indicating that the CNU will finish in 3 cycles. However, because conventional implementations only save values for a single row, and because of the abovementioned rules, it cannot update its saved minimums from row 3 until the VNU completes row 3. This is because the VNU is still using them. The VNU will take 19 (# of non-bank) cycles to process row 3. This means the CNU will be idle for 16 cycles (19-3). This will reduce throughput and require more hardware decoders to accommodate a required data rate.

A decoder in accordance with some embodiments of the inventive concepts saves the minimum values for 2 (or more) rows. Referring again to FIG. 9, this allows the CNU to update its minimum values after processing row 4 and continue on to row 5. In addition, because of the above-mentioned rule concerning alternate processing by CNUs and VNUs, the CNU operations in row 5 are re-ordered to process columns that have blanks in row 4. For example, the CNU would skip column 0 and 1, and start with column 3, 12, and so on.

Figure 1:
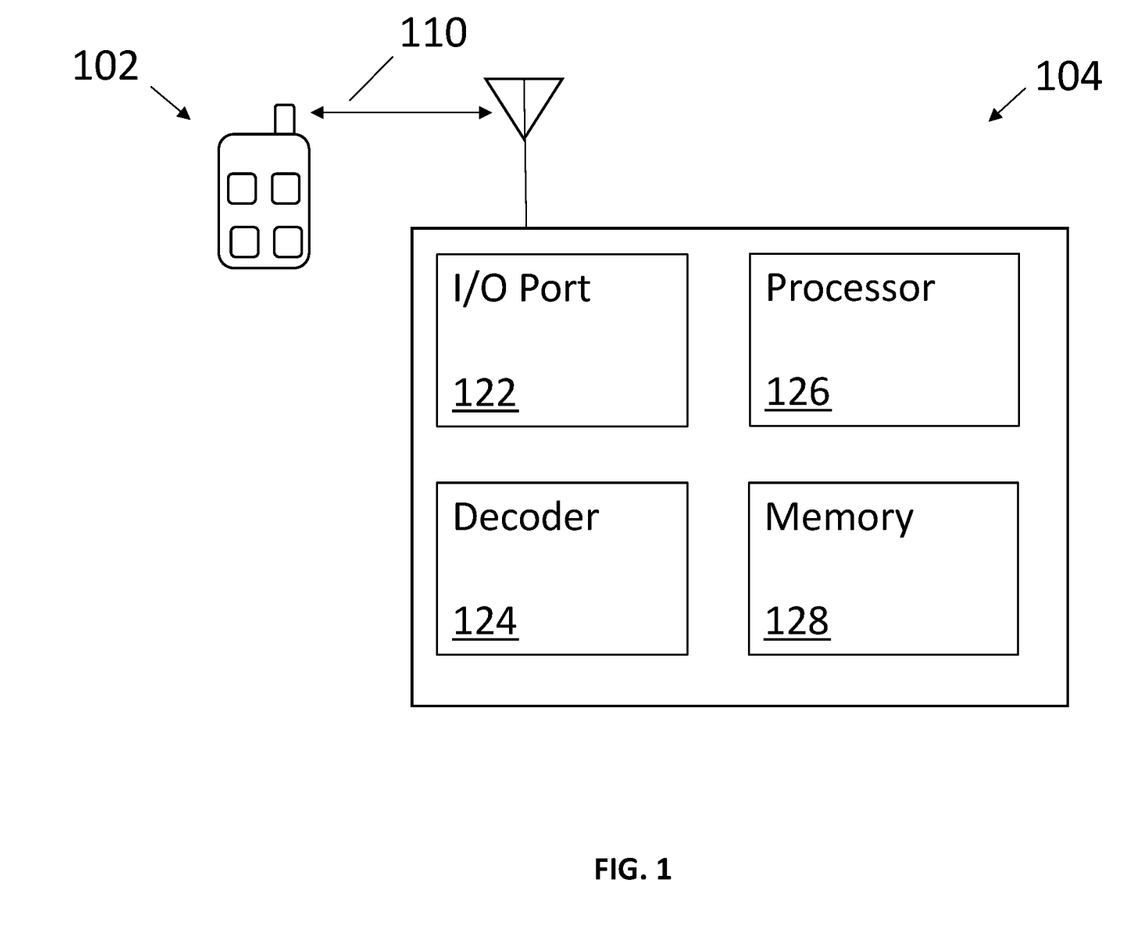
FIG. 1 is a block diagram of a system comprising wireless transceivers for exchanging and processing signals encoded using an LDPC code in which embodiments of the present inventive concepts are practiced.

Referring to FIG. 1, a wireless transmitting device 102 and a wireless receiving device 104 exchange data via one or more transmission channels 110, collectively referred to as a communication path, channel, or link. As previously described, the transmission channels 110 may be susceptible to noise, interference, or the like that can cause errors in the data received by the wireless receiving device 104. In some embodiments, the wireless transmitting device 102 and wireless receiving device 104 comply with different technical standards. For example, wireless receiving device 104 can decode messages or related data according to different wireless networking standards, including but not limited to 5G New Radio (NR), IEEE 802.11ad, and so on. In some embodiments, the wireless transmitting device 102 and/or wireless receiving device 104 are implemented as a system on a chip (SoC) or other integrated circuit in various industrial, commercial, and consumer applications, for example, digital networking devices.

In order to detect, demodulate, and/or decode signals received from the wireless receiving device 104, and to correct errors identified in the received data, the wireless receiving device 104 in some embodiments includes an I/O port 122, an LDPC decoder 124, a processor 126, and a memory 128. Some or all elements of the wireless receiving device 104 such as the LDPC decoder 124 may be implemented in an application specific integrated circuit ("ASIC"), a SoC, or a field programmable gate array ("FPGA") but not limited thereto. Other embodiments include components of the wireless receiving device 104 such as the LDPC decoder 124 implemented as software programming executed by the processor 126. Some embodiments of the wireless receiving device 104 include the LDPC decoder 124 and/or other components of FIG. 1 implemented as a combination of software and other electronic circuits.

The I/O port 122 is adapted to detect the signals of the transmission channel 110 from transmitter 102. The I/O port 122 may include any suitable protocol for receiving encoded signals from the transmitter 102. The encoded signals detected by the I/O port 122 are provided to the LDPC decoder 124. The LDPC decoder 124 is constructed and arranged to detect and correct errors introduced onto the transmission channel 110. In some embodiments, the LDPC decoder 124 computes LDPC codes according to one or more different technical standards, for example, 5G New Radio (NR), IEEE 802.11ad, and so on described herein but not limited thereto.

The processor 126 may be any suitable computer processor for executing code stored in the memory 128, and is constructed and arranged to process received data in the form of coded messages, for example, posteriori log-likelihood ratio (LLR) messages. The memory 128 may be any suitable type of storage for computer related data and/or programming which may be, for example but not limited to, random access memory (RAM), dynamic random access memory (DRAM), static random access memory (SRAM), and so on.

Figure 2:
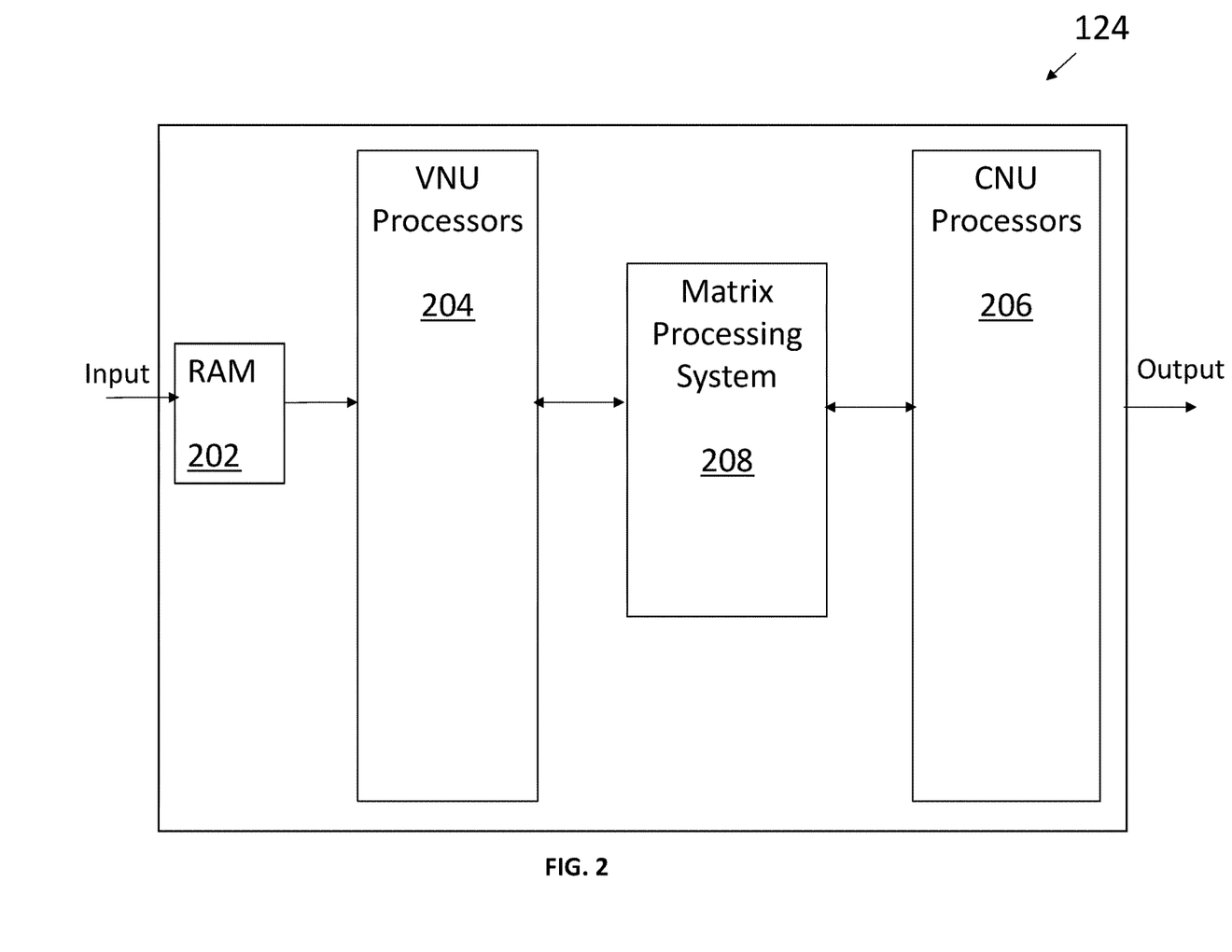
FIG. 2 is a block diagram of a multi-standard LDPC decoder, in accordance with some embodiments.

FIG. 2 is a block diagram of the multi-standard LDPC decoder 124 of FIG. 1. The multi-standard LDPC decoder 124 is deployed on silicon, for example, as a system comprising hardware alone or in combination with software.

In some embodiments, the LDPC decoder 124 performs iterative error correcting functions, which requires a parallel network of nodes for processing a parity check matrix. Each decoding iteration consists of updating data in the form of messages received by a RAM 202 from a transmission channel 110, and exchanging the data between nodes of a VNU processor 204 and a CNU processor 206. In some embodiments, the variable nodes and the check nodes are updated once per iteration. A message having a predetermined bit value may be expressed in the form of a posteriori log-likelihood ratio (LLR) value from the communication channel 110 which is exchanged between the variable nodes 204 and check nodes 206.

Figure 9:
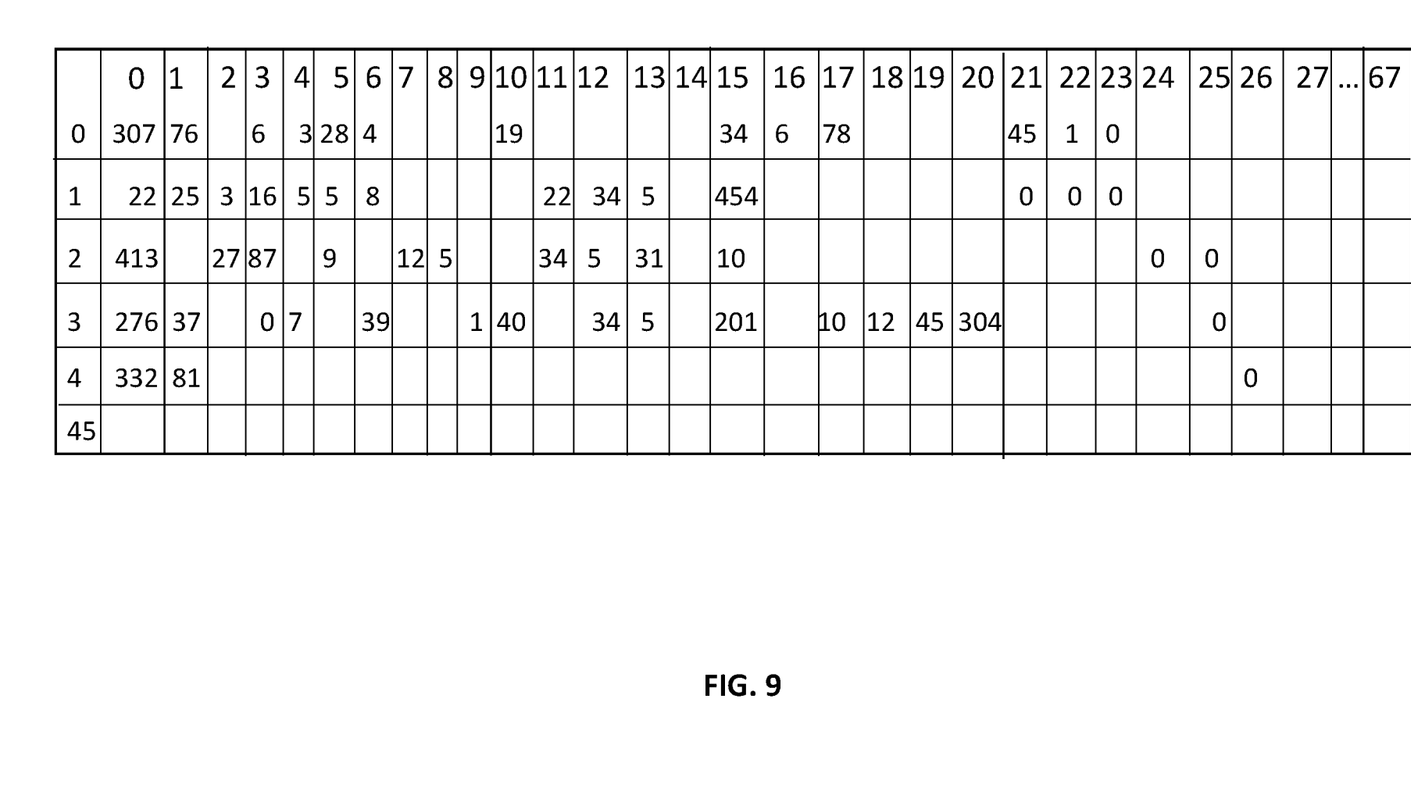
FIG. 9 illustrates a graphical representation of a parity check matrix, in accordance with some embodiments.

As previously described, the LDPC decoder 124 is constructed and arranged to decode LDPC codes according to a variety of different technical standards. A QC-LDPC code may be implemented by a parity-check matrix, for example, having a low density where most entries are 0 values as shown in FIG. 9. However, some matrices may have different arrangements, configurations, sizes, etc. than others due to their compliance with various standards. A feature of the LDPC decoder 124 in accordance with some embodiments is to process LDPC codes complying with different industry standards regardless of the size of the matrices. The LDPC decoder 124 is capable of processing LDPC codes used in different industry standards, which improves efficiency of the decoder 124 because hardware elements of the decoder 124 not used to process a particular matrix can nevertheless process multiple code blocks of a different matrix at the same time, thereby reducing the number of decoders required to satisfy throughput requirements, since a single encoder or LDPC decoder 124 is required to process block codes, more specifically LDPC codes or a class of error correcting codes that use a parity check matrix, even though the matrix according to one industry or technical standard may be different than another matrix according to a different industry or technical standard. The parity check matrix comprises a plurality of sub-matrices, each having a predetermined size ($Z_c$). The LDPC decoder 124 processes one sub-matrix at a time. Unlike conventional LDPC systems which change the value of a sub-matrix $Z_c$ to control the amount of error corrections, in some embodiments, the LDPC decoder 124 accommodates a large value of a sub-matrix $Z_c$ to decode different standards, and processes multiple code blocks of LDPC codes at a time to improve throughput, regardless of whether the standards use different matrices.

Figure 4:
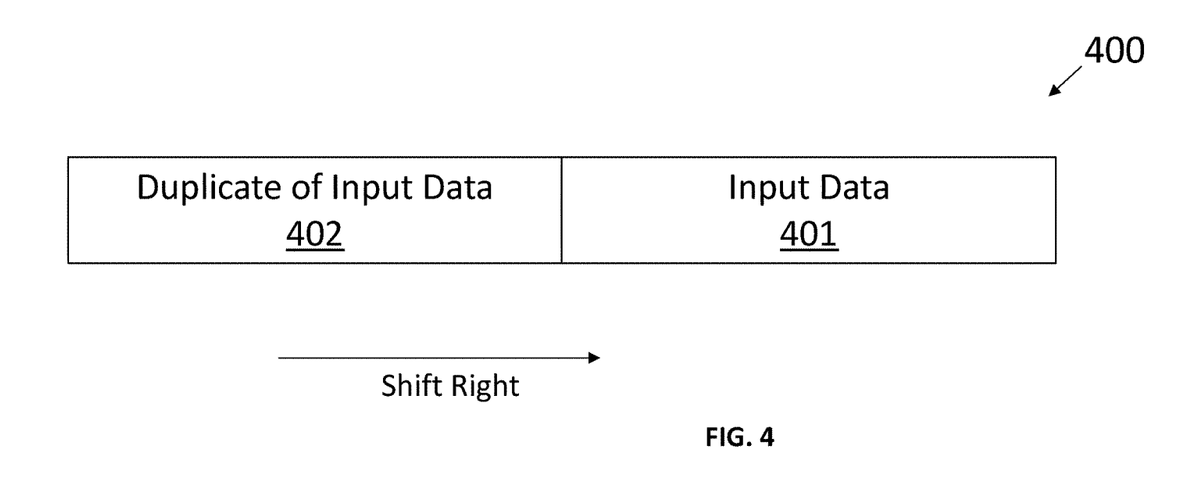
FIG. 4 is a view of an arrangement of data during an operation of a circular shifter, in accordance with some embodiments.
Figure 5:
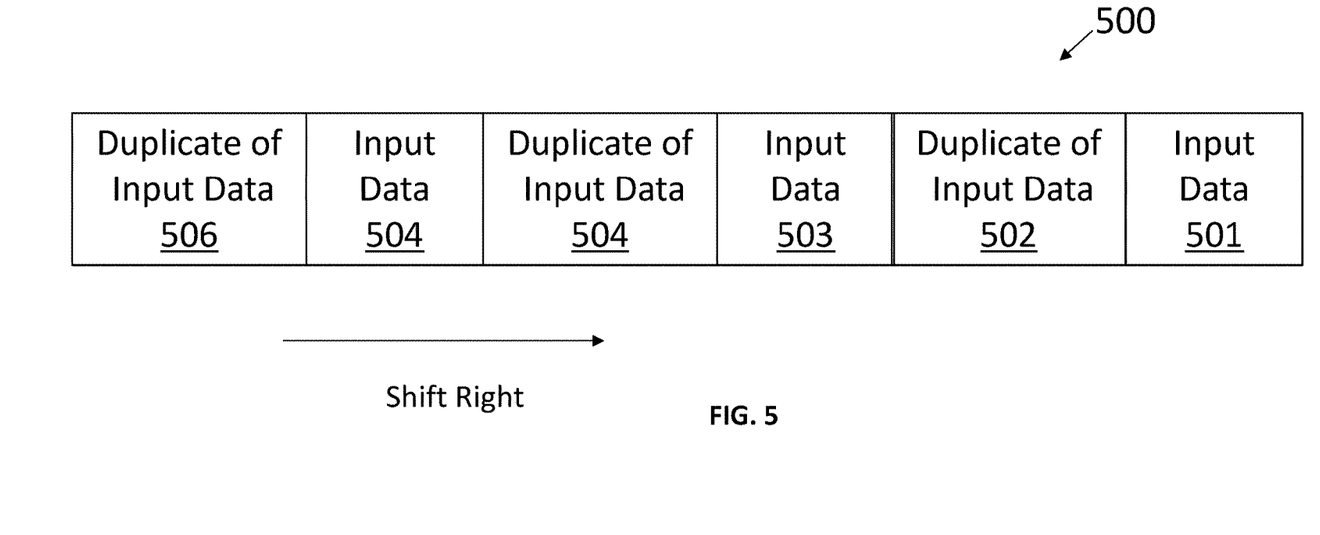
FIG. 5 is a view of an arrangement of data during an operation of a circular shifter, in accordance with other embodiments.

As is well-known in decoding architectures, each bit of an LDPC code word corresponds to a column of a parity check matrix, and each row of the matrix corresponds to a single parity check. Each bit having a value "1" in the parity check matrix is represented by an edge between a corresponding variable node, i.e., column of a VNU and a check node, i.e., row of a CNU. Each row/column in each sub-matrix of the parity check matrix requires a RAM data path for processing the data in the row/column. As described herein, when the LDPC decoder 124 processes a sub-matrix size less a predetermined sub-matrix $Z_c$, the extra data paths are used to decode different code words at the same time. As described herein, the check node signal decoding processor 206 can include a circular shifter 310 (see FIG. 3) constructed and arranged to address any unused data paths in the RAMs. Referring to FIG. 5, each LLR in the LDPC decoder data path is defined. FIG. 4 shows a shifter 400 for the larger submatrix Zc. The operation performed in FIG. 4 by the hardware is to shift the entire structure to the right and then truncate the right half down to Zc LLRs. In FIG. 5, the entire structure is shifted to the right, and data of every other group of Zc LLRs is extracted.

During operation, an LDPC encoder of the wireless transmitting device 102 adds one or more parity bits for redundancy to each code word, thereby modifying a message to include an error correcting code word and permitting the LDPC decoder 124 to verify the validity of the code word. In some embodiments, the decoder 124 relies on the parity bits to identify a most likely encoded sequence of bits based on samples of a modulated signal, for example, received on a channel from the encoder. In some embodiment, a modulator and demodulator of the encoder and/or decoder provide further processing of signals received via the transmission channel 110.

Referring again to FIG. 2, the LDPC decoder 124 includes one or more memory devices, for example, RAM 202 constructed and arranged to receive input data from a communication channel either directly or indirectly (via intermediate electronic devices such as a modulator or the like) from an LDPC decoder 124, and store one or more code words for subsequent processing by a matrix processing system 208. Although not shown, the RAM 202 comprises multiple memories, the size and arrangement of each depending on a maximum sub-matrix size, required throughput, and so on. In some embodiments, the RAM 202 can be part of the memory 128 of the receiver 104 of FIG. 1.

The circular shifter 310 or related combinational logic circuit of the LDPC decoder 124 is constructed and arranged to support different cyclic LDPC sub-matrices, in particular, cyclic shifts of any size up to a predefined maximum submatrix size ranging from large sub-matrix single code word to small sub-matrix multiple code words. The shifter 310 receives messages from the RAM 202, for example, via an intervening multiplexer 304, and distributes the messages, more specifically, code words or the like, aligned with their requisite check nodes managed by the matrix processing system 208. In some embodiments, the circular shifter 310 exchanges bits of data between one or more VNUs 204 and CNUs 206. Accordingly, the circular shifter 310 in exchanging messages between the VNUs 204 and CNUs 206 allow the LDPC decoder 124 to support different LDPC codes with different sub-matrices.

In some embodiments, a plurality of registers or the like (not shown) are constructed and arranged to perform layered-LDPC decoding operations on the input data code word bits for a predetermined number of pipeline stages, thereby further contributing to a high decoding throughput.

The matrix processing system 208 includes a plurality of logic circuits, each for providing independent data paths of different code words, and for simultaneously or near simultaneously decoding the different code words. Accordingly, the matrix processing system 208, in particular, including the special-purpose shifter 310, can process multiple code blocks corresponding to LDPC codes complying with different standards.

Figure 3:
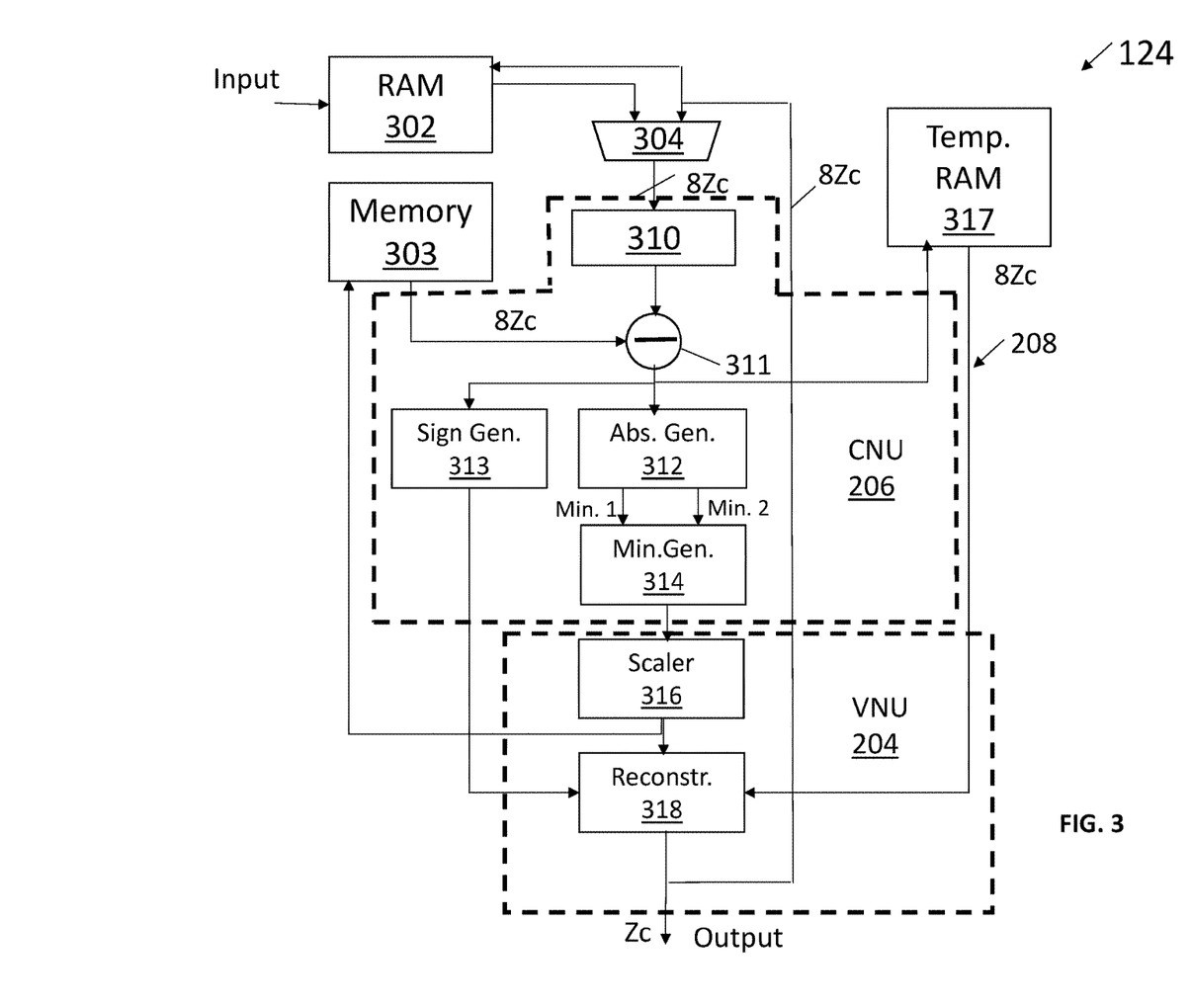
FIG. 3 is a schematic diagram of a matrix processing system of the LDPC decoder of FIG. 2, in accordance with some embodiments.

FIG. 3 is a schematic diagram of a matrix processing system 208, in accordance with some embodiments. As shown, the matrix processing system 208 can include but not be limited to a first memory 302, a second memory 303, at least one multiplexer 304 and at least one shifter 310. In some embodiments, the matrix processing system 208 may include one or more hardware elements of a VNU processor 204 and/or CNU processor 206 shown and described with respect to FIG. 2.

In some embodiments, the first memory 302 is a RAM or the like that stores posteriori messages for the variable nodes, e.g., coded bits of VNU processor 204 of FIG. 2. The messages are initialized with the corresponding a priori (channel) reliability values of the coded bits. An important feature of the inventive concepts is that the first memory 302 can output the data bits of multiple LDPC code blocks simultaneously or near-simultaneously to the multiplexer 304 or the like. In a decoding process, the multiplexer 304 receives LLR values in a clock cycle of an iteration of the decoding process. The channel values, LLR messages, or the like may arrive at the multiplexer 304 in chunks, or code words in a manner that permits the circular shifter 310 to shift by an appropriate amount.

Referring again to the circular shifter 310, the shifter 310 is constructed and arranged to process code words of various sizes, regardless of parity check matrix or sub-matrices thereof. In doing so, other decoder hardware, e.g., at the output of the shifter 310 does not require a corresponding modification, and can therefore equally apply regardless of industrial standard. In some embodiments, the second memory 303, also referred to as a branch metric RAM, or check RAM. The second memory 303 is constructed and arranged to output LLR values from the output of a VNU, which may include a scaler 316, to the input of the CNU 206. The output of the temporary RAM 317, which is an LLR output from the CNU, e.g., output of the subtractor 311 prior to the absolute value calculator 312, a sign generator 313 to an input of the temporary RAM 317 for subsequent processing by a VNU.

For example, referring again to FIG. 4, in some embodiments the circular shifter 310 processes a single code word 400. The code word 400 can be implemented according to a particular industry standard such as the 5G cellular standard. The shifter 310 can receive and process code words 400 of various different lengths. In some embodiments, the amount shift applied by the shifter 310 depending on the size of the code word 400 being decoded. For example, the circular shifter 310 is implemented to shift both input data, e.g., a code word 401 and a duplicate of the input data 402. When a shift occurs to the right, some or all bits of the input data 401 may be dropped, or deleted. However, the duplicate data 402 is available for further processing after output from the shifter 310. For example, an eight-bit circular right shifter may operate as follows: b(n) corresponds to an LLR(byte) n. Prior to a shift, provided is data b(7), b(6), b(5), b(4), b(3), b(2), b(1), and b(0). After a right shift b(0), b(7), b(6), b(5), b(4), b(3), b(2), and b(1) in some embodiments, the right shift to be applied by the circular shifter 310 may be applied to an input signal using a plurality of pipeline stages.

Referring now to FIG. 5, in some embodiments the circular shifter 310 receives and processes multiple code words at a time. Here, the shifter 310 operates differently than when processing a single code word only in that duplicates of multiple input data, i.e., multiple code words, multiple truncations are required after a shift right operation or the like. For example, a shift right of one or more bits results in the rightmost least significant bits truncated off. However, the duplicate input data is present for output and subsequent processing by the check node signal decoding processor 206. Accordingly, the shifter 310 can avoid the need for duplication of hardware otherwise required by performing a cyclic shift of multiple LDPC code words In another example, as shown in FIGS. 3 and 5, the shifter 310 may be implemented to provide a circular shift of a single code block with Zc=8, where b(n) corresponds to an LLR(byte) n. The starting data includes b(7), b(6), b(5), b(4), b(3), b(2), b(1), b(0). The data is duplicated as follows: b(7), b(6), b(5), b(4), b(3), b(2), b(1), b(0), b(7), b(6), b(5), b(4), b(3), b(2), b(1), b(0). Subsequently, the data is logic shifted right as follows: b(0), b(7), b(6), b(5), b(4), b(3), b(2), b(1), b(0), b(7), b(6), b(5), b(4), b(3), b(2), b(1). Then the data is truncated back to eight elements as follows: b(0), b(7), b(6), b(5), b(4), b(3), b(2), b(1).

As previously mentioned, the shifter 310 outputs the shifted code word bits of received multiple stripes in the form of values from the first memory 302 to be routed to the correct check node signal decoding processor 206. The hardware components of the check node signal decoding processor 206 do not require modifications unique for LDPC code words of different industry standards because of the abovementioned features of the shifter 310. For example, each data path may be provided for each row in a sub-matrix Zc. As shown in FIG. 3, multiple copies of the sub-matrix Zc are generated at a check node signal decoding processor 206 portion of the matrix processing system 208. In this example, the bus width at this location of the system 208 is 8×Zc bits because the LLRs are 8 bits each and there are Zc of them.

In some embodiments, the check node signal decoding processor 206 comprises a subtractor 311 that receives and processes message data output of the shifter 310 and the second memory 303, which stores check node messages or the like from the same layer. Accordingly, LLR values output from the shifter 310 are subtracted. The subtractor 311 is constructed and arranged to remove the contribution from the column being processed, wherein the contribution is updated then added back in using an adder (not shown) of a reconstruction processor 318.

In some embodiments, the check node signal decoding processor 206 for providing one or more CNUs also includes an absolute value calculator 312, a sign generator 313, and a minimum data generator unit 314. A VNU processor 320 may include a flip-flop circuit (not shown) at an output of the temporary RAM 317, a scaler 316 and a reconstruction processor 318, which are well-known LDPC components so descriptions of their functions and structures are omitted for brevity.

Figure 6:
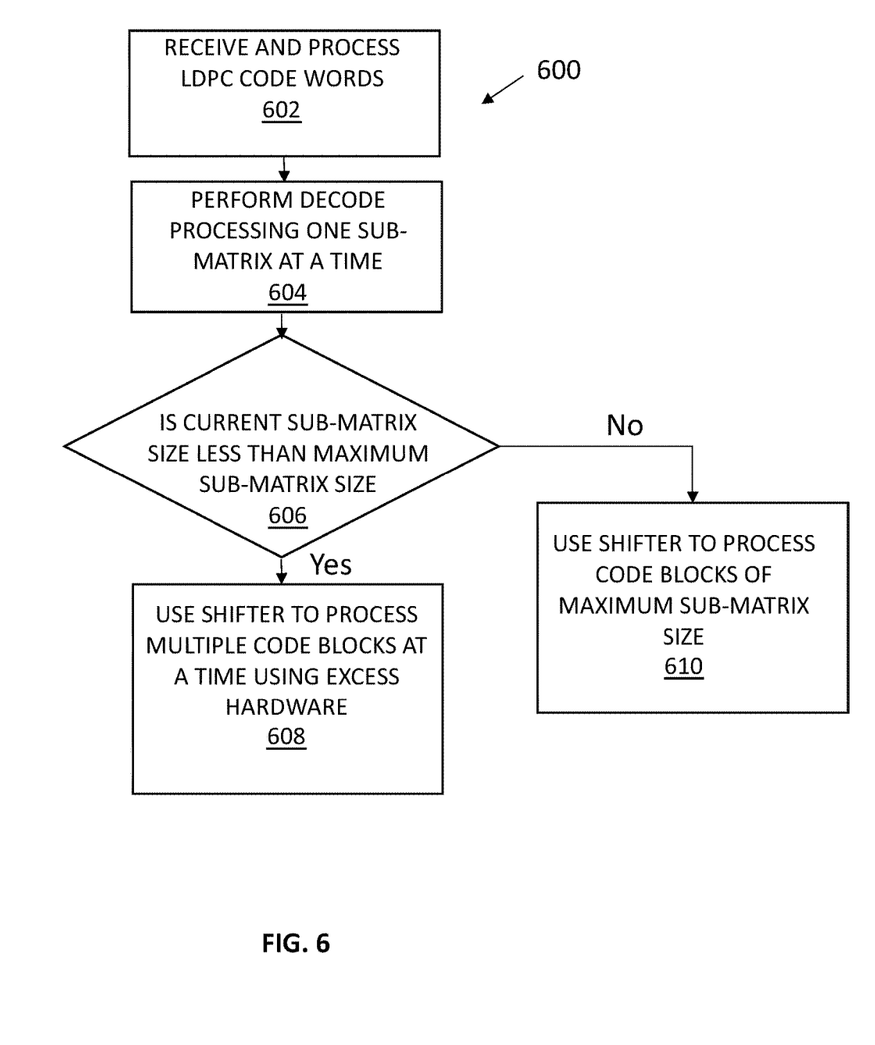
FIG. 6 is a flowchart illustrating a method of operation of a multi-standard LDPC decoder, in accordance with some embodiments.

FIG. 6 is a flowchart illustrating a method 600 for wireless communication, in accordance with some embodiments. Some or all steps of the method 600 can be performed in a wireless receiving device, for example, receiver 104 of FIGS. 1-5. Accordingly, when describing the method 600, reference is made to elements of the wireless receiving device 104 of FIGS. 1-5.

At block 602, the LDPC decoder 124 receives a plurality of LDPC code words. As is described in relation to FIG. 1, the plurality of code words may be received from signals provided via a transmission channel 110. Accordingly, the received code words may be corrupted due to interference, noise, or other physical phenomena associated with transmission channel 110. The received code words as part of LLR messages or the like may include payload data and parity data, such as payload data and parity bits, but not limited thereto. In doing so, the LDPC encoder (not shown) may add parity bits to each code word, wherein the decoder 124 find the most likely encoded sequence based on received samples of the code word.

As described herein, LDPC codes use a large parity check matrix including a combination of smaller sub-matrices. As shown in FIG. 3 and at block 604, one sub-matrix (Zc) is processed by the decoder 124 at a time. Each sub-matrix (Zc) is a square matrix, i.e., having a same number of rows as columns. When processing a sub-matrix, the shifter 120 shifts its contents (e.g., rows or columns comprising one or more code words) to the right by a predetermined number of positions to receive and process the next set of code words of the matrix. In some embodiments, the shifter 120 shifts multiple code words at a time (see for example, FIG. 5).

At block 606, in some embodiments, a determination is made whether a current sub-matrix size is less than a maximum sub-matrix size. In other embodiments, a determination is not required or made for every sub-matrix, and is controlled by a static mode bit. In configurations, for example, compliance is made with an 802.11ad protocol mode where multiple code words are processed at a time, or a 5G protocol mode where one code word is processed at a time.

The hardware components such as the decoding circuits of the LDPC decoder 124 are constructed and arranged to receive and process a sub-matrix of a maximum size. However, when processing smaller matrices, some of the hardware of the LDPC decoder 124 may be unused, which is inefficient. As discussed in some examples herein, elements such as bus wiring, RAMs, and the shifter 310 can be 8Zc bits wide. When the sub-matrix Zc is larger than required, those extra bits are wasted. Also, there are Zc copies of the hardware in the dotted line box labeled xZc. Those extra copies are not used when Zc is larger than it needs to be. However, at block 608, the excess hardware that would otherwise be unused for processing smaller matrices when including the shifter 120 can process multiple code blocks at a time using the excess hardware. Otherwise, at block 610, a larger sub-matrix single code word is processed by the shifter 120. The primary difference between blocks 608 and 610 is in the duplication pattern and truncation functions performed by the shifter 120.

Figure 7:
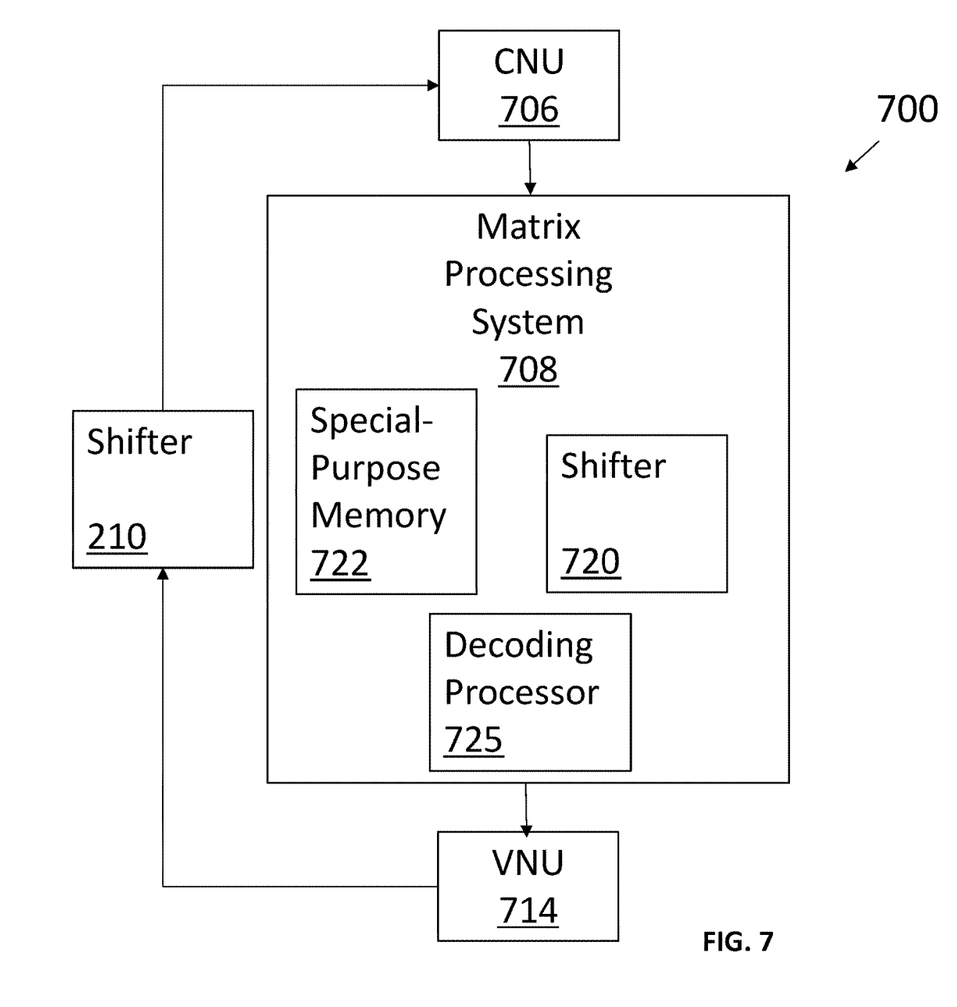
FIG. 7 is a block diagram of a multi-standard LDPC decoder, in accordance with some embodiments.

FIG. 7 is a block diagram of a multi-standard LDPC decoder 700, in accordance with some embodiments. As shown, the LDPC decoder 700 can include but not be limited to one or more CNU processors 706, a matrix processing system 708, and one or more VNU processors 714. FIG. 7 illustrates the increase of an output storage of the CNU processor 706 but not the number of data paths of the CNU processor 706. This is achieved by processing one sub-matrix at a time but storing multiple CNU results, which allows the VNU 714 to process any sub-matrix from two or more rows of the parity check matrix processed by the CNU processor 706, resulting in reduced RAM access contentions and improvements in data dependencies.

In some embodiments, the matrix processing system 708 comprises a shifter 720, a memory 722, and a decoding processor 725. The shifter 720 is similar to the shifter 310 described in FIGS. 1-6 so repetitive details are omitted for brevity. Although not shown, some or all elements, or portions thereof, of one or more of the shifter 720, memory 722, and decoding processor 725 may be part of the CNU processors 706 and/or the VNU processors 714.

During operation, the CNU processor 706 processes one row of a sub-matrix at a time, for example, of a 5G-NR parity check matrix but other matrices of other standards may equally apply. After a row has been processed, the $1^{st}$ minimum, $2^{nd}$ minimum, and location of the $1^{st}$ minimum are output to the VNU 714 via the decoding processor 725. In this example, the $1^{st}$ minimum, $2^{nd}$ minimum, and location of the $1^{st}$ minimum can be processed by the minimum data generator unit 314 and/or other well-known LDPC components of FIG. 3 for routing the messages from a memory, e.g., RAM 302 shown in FIG. 3, to predetermined processing units as quickly as possible. A logic circuit, which may similar to that of the CNU 206 of FIG. 3 and includes at least the minimum data generator unit 314, identifies the 1st and 2nd minimum values across a particular row. The CNU 706 stores, for example, at memory 722, the current minimum for the row as it updates it for each column it processes. After the CNU completes an entire row, it transfers the minimum values to a saved copy of the minimum values. The VNU 714 then uses this saved copy to process the row the CNU previously completed.

The VNU 714 is only configured to process rows that have been completed by the CNU processor 706. In some embodiments, the special-purpose memory 722 is constructed and arranged to store the results from two rows completed by the CNU processor 706. In some embodiments, the special-purpose memory 722 includes a plurality of flip-flop circuits or the like. In other embodiments, the special-purpose memory 722 is constructed and arranged to store the results from more than two rows, e.g., three rows, completed by the CNUs 706. The storage by the memory 722 of an extra row of CNU results allows for additional flexibility with respect to reordering of the VNU 714, for example, permitting the VNU 714 to process any sub-matrix from the two rows of CNU results stored at the special-purpose memory 722. This is different than conventional techniques where multiple CNUs are required so that a processor can process an entire CNU rather than the CNU results alone. Although the special-purpose memory 722 is shown as part of the decoding processor 725, other embodiments may include the special-purpose memory 722 as part of the CNU processor 706. Although additional silicon area is required for the special-purpose memory 722, in particular, for storing one or more additional rows of CNU results, this configuration provides additional throughput as compared to the absence of the special-purpose memory 722, which in turn would require additional decoder cores and therefore significantly more silicon area than that required by the special-purpose memory or comparable throughput capabilities. The flexibility of the VNU 714 also reduces RAM access contentions and reduces data dependencies. For example, as described above, the storage for an extra row of a CNU results allows for more flexibility because of how the data is processed.

Figure 8:
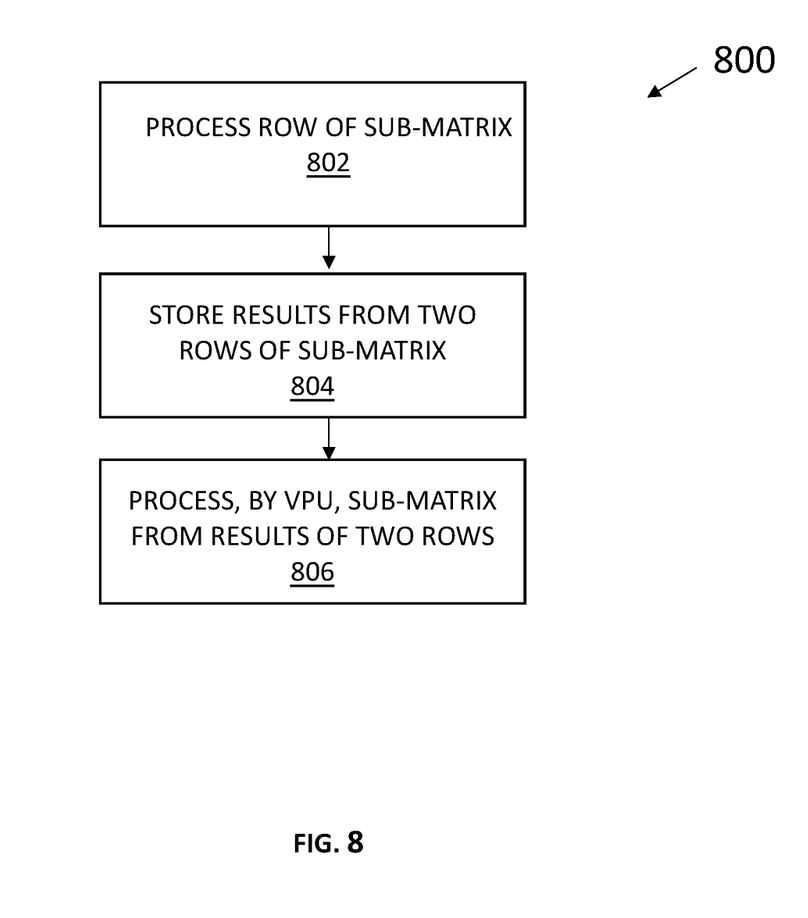
FIG. 8 is a flowchart illustrating a method of operation of a multi-standard LDPC decoder, in accordance with some embodiments.

FIG. 8 is a flowchart illustrating a method 800 of operation of a multi-standard LDPC decoder, in accordance with some embodiments. Some or all steps of the method 800 can be performed in a wireless receiving device, for example, receiver 104 of FIG. 7. Accordingly, when describing the method 700, reference is made to elements of the multi-standard LDPC decoder 700 of FIG. 7.

At block 802, the CNU processor 706 processes one row of a parity check matrix, one sub-matrix at a time.

At block 804, the results of two rows processed by the CNU processor 706 are stored at the special-purpose memory 720.

At block 806, the VPU 714 processes a sub-matrix from the two rows processed by the CNU processor 706, for example, shown in FIG. 9.

FIG. 9 illustrates a graphical representation of a parity check matrix, in accordance with some embodiments. In this example, the matrix has 68 columns and 46 rows, although a relevant portion of the matrix is shown for brevity. Each entry can be replaced by a square submatrix. Blank entries correspond to an all 0s sub-matrix. Entries with values correspond to a shifted identity matrix and are processed accordingly. The values in the matrix determine how much the data is shifted. The CNU processor 706 processes one row of the matrix one submatrix at a time. For example, as shown, the CNU processor 706 can begin with the Zc by Zc submatrix having a value of 307. Blank entries are not processed. After the CNU processor 706 processes a row, the 1st minimum, 2nd minimum, and location of the 1st minimum are output to the VNU 714, which processes only rows completed by the CNU processor 706. Since the memory stores the results of two rows, additional flexibility in the re-ordering of the VNU 714 is provided as well as additional throughput.

As will be appreciated, embodiments as disclosed include at least the following embodiments. In one embodiment, a wireless receiving device comprises low-density parity check (LDPC) decoding circuit, which comprises a circular shifter (310) constructed and arranged to simultaneously process multiple code words of a parity check matrix configured for different wireless communication standards, including performing a cyclic shift operation of the multiple code words to align with one or more requisite check nodes of a decoder; and a logic circuit (312, 313, 314) at an output of the circular shifter constructed and arranged for a matrix larger than the parity check matrix and that includes components having excess hardware due to the construction and arrangement for the larger matrix to decode the multiple code words of the smaller parity check matrix for output to the one or more requisite check nodes.

Alternative embodiments of the wireless receiving device include one of the following features, or any combination thereof.

The excess hardware includes one or more of a data path, random access memory, and flip-flop storage that is reused to decode the multiple code words.

The LDPC decoding circuit further comprises at least one check node updating (CNU) processor that includes the circular shifter and at least one variable node updating (VNU) processor that receives an output of the logic circuit that operate on a sub-matrix of the parity check matrix every clock cycle.

The logic circuit includes a minimum data generator unit that identifies first and second minimum values across a row of the parity check matrix, wherein the CNU processor includes a memory that stores current minimum values for the row as it updates the memory for each column of the parity check matrix, wherein a copy of the minimum values is stored, and wherein the VNU processor processes the stored copy of the minimum values to process the row previously completed by the at least one CNU processor.

The memory saves minimum values for two or more rows of the parity check matrix processed by the at least one CNU processor.

The memory includes one or more flip-flop circuits.

The circular shifter shifts one row of results of the CNU processor at a time, and stores results from two rows, respectively, and wherein the VNU processor processes a sub-matrix of the parity check matrix from the two rows of results.

The circular shifter shifts the multiple code words at the same time.

The circular shifter shifts a set of the multiple code words of the parity check matrix at a time to the right by a predetermined number of positions to receive and process a next set of multiple code words of the parity check matrix.

In another embodiment, a low-density parity check (LDPC) decoding circuit of a wireless device comprises a variable node updating (VNU) processor; a check node updating (CNU) processor; and a matrix processing system, comprising: a special-purpose memory apparatus that stores results generated by the CNU processor of at least a first row and a second row of CNU data generated by the CNU processor; and a decoding processor that processes the results of the at least the first row and the second row of CNU for output to the VNU processor.

Alternative embodiments of the LDPC decoding circuit include one of the following features, or any combination thereof. At least one of the VNU processor, the CNU processor, and the matrix processing system includes additional circuits constructed and arranged for processing a matrix larger than a matrix comprising a row of CNU data, wherein the additional circuits simultaneously process multiple code words of the first and the second row of CNU data.

The excess hardware includes one or more of a data path, random access memory, and flip-flop storage that is reused to decode the multiple code words.

The matrix processing system further comprises a shifter that receives an output that operates on a sub-matrix every clock cycle. The shifter shifts one row at a time, the special-purpose memory apparatus stores two results from the first and second rows, and wherein the VNU processor processes a sub-matrix of the parity check matrix from the two rows of results. The circular shifter shifts a set of the multiple code words of the parity check matrix at a time to the right by a predetermined number of positions to receive and process a next set of multiple code words of the parity check matrix. The LDPC decoding circuit further comprises a minimum data generator unit that identifies first and second minimum values across the first and second rows, wherein the CNU processor stores current minimum values for the row as it updates a memory for each column of the parity check matrix, wherein a copy of the minimum values is stored, and wherein the VNU processor processes the stored copy of the minimum values to process the row previously completed by the at least one CNU processor.

The memory includes one or more flip-flop circuits.

In another embodiment, a method of operation of a low-density parity check (LDPC) decoder, comprises simultaneously processing, by a circular shifter, multiple code words of a parity check matrix configured for different wireless communication standards, including: performing a cyclic shift operation of the multiple code words to align with one or more requisite check nodes; processing, by excess hardware of the LDPC decoder constructed and arranged for a larger matrix than the parity check matrix, the multiple code words, including: decoding the multiple code words of the parity check matrix for output to the one or more requisite check nodes; storing results of two or more rows including the multiple code words; and processing, by a variable node updating (VNU) processor, the parity check matrix from the results of the stored two or more rows.

Alternative embodiments of the method include one of the following features, or any combination thereof. Performing the cyclic shift operation includes shifting one row of results of the CNU processor corresponding to the multiple code words at a time, storing the results of two rows of the results, and processing by the VNU processor a sub-matrix of the parity check matrix from the two rows of results.

A circular shift is performed the multiple code words at a same time to the right by a predetermined number of positions to receive and process a next set of multiple code words of the parity check matrix.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A wireless receiving device, comprising:
a low-density parity check (LDPC) decoding circuit, comprising:
a circular shifter constructed and arranged to simultaneously process multiple code words of a parity check matrix configured for different wireless communication standards, including performing a cyclic shift operation of the multiple code words to align with one or more requisite check nodes of a decoder;
an intermediate memory; and
a logic circuit at an output of the circular shifter constructed and arranged for a matrix larger than the parity check matrix and that includes components having excess hardware due to the construction and arrangement for the larger matrix, wherein the logic circuit is configured to decode the multiple code words of the parity check matrix at a same time for output to the one or more requisite check nodes by being configured to:
perform at least one first calculation on the multiple code words to obtain intermediate results;
store the intermediate results in the intermediate memory; and
perform at least one second calculation on the intermediate results stored in the intermediate memory.

2. The wireless receiving device of claim 1, wherein the excess hardware includes one or more of a data path, random access memory, and flip-flop storage that is reused to decode the multiple code words at a same time.

3. The wireless receiving device of claim 1, further comprising at least one check node updating (CNU) processor that includes the circular shifter and at least one variable node updating (VNU) processor, wherein the at least one VNU processor is configured to obtain the intermediate results stored in the intermediate memory and perform the at least one second calculation on the intermediate results every clock cycle.

4. The wireless receiving device of claim 3, wherein:
the logic circuit includes a minimum data generator unit configured to perform the at least one first calculation;
the at least one first calculation comprises identification of first and second minimum values across a row of the parity check matrix;
the intermediate results comprise current minimum values for the row of the parity check matrix;
the at least one CNU processor is further configured to store, in the intermediate memory, the intermediate results; and
the at least one VNU processor is further configured to process prior intermediate results comprising current minimum values corresponding to a row of the parity check matrix previously processed by the at least one CNU processor.

5. The wireless receiving device of claim 4, wherein the intermediate memory stores current minimum values corresponding to two or more rows of the parity check matrix previously processed by the at least one CNU processor.

6. The wireless receiving device of claim 5, wherein the intermediate memory includes one or more flip-flop circuits.

7. The wireless receiving device of claim 4, wherein the circular shifter is configured to shift one row of intermediate results of the at least one CNU processor at a time, wherein the intermediate memory is configured to store intermediate results corresponding to two rows of the parity check matrix, and wherein the at least one VNU processor is configured to process a sub-matrix of the parity check matrix based on the intermediate results corresponding to the two rows of the parity check matrix.

8. The wireless receiving device of claim 1, wherein the circular shifter is configured to shift the multiple code words at the same time.

9. The wireless receiving device of claim 1, wherein the circular shifter is configured to shift a set of the multiple code words of the parity check matrix at a same time to the right by a predetermined number of positions in order to receive and process a next set of multiple code words of the parity check matrix.

10. A low-density parity check (LDPC) decoding circuit of a wireless device, comprising:
a variable node updating (VNU) processor;
a check node updating (CNU) processor configured to perform, at a same time and on multiple code words of a parity check matrix, at least one first calculation to obtain intermediate results; and
a matrix processing system, comprising:
a special-purpose memory apparatus that stores the intermediate results generated by the CNU processor and corresponding to at least a first row and a second row of the parity check matrix; and
a decoding processor that provides the intermediate results corresponding to the at least the first row and the second row of the parity check matrix to the VNU processor.

11. The LDPC decoding circuit of claim 10, wherein at least one of the VNU processor, the CNU processor, and the matrix processing system includes additional circuits constructed and arranged for processing a matrix larger than the parity check matrix, wherein the additional circuits simultaneously process the multiple code words of a row of the parity check matrix.

12. The LDPC decoding circuit of claim 11, wherein the additional circuits include one or more of a data path, random access memory, and flip-flop storage that is reused to decode the multiple code words.

13. The LDPC decoding circuit of claim 11, wherein the matrix processing system further comprises a shifter that receives an output that operates on a sub-matrix every clock cycle.

14. The LDPC decoding circuit of claim 13, wherein the shifter shifts one of the first and second rows at a time, wherein the special-purpose memory apparatus stores two results from each of the first and second rows, and wherein the VNU processor processes a sub-matrix of the parity check matrix from the intermediate results corresponding to the first and second rows.

15. The LDPC decoding circuit of claim 14, wherein the memory includes one or more flip-flop circuits.

16. The LDPC decoding circuit of claim 13, wherein the shifter shifts a set of the multiple code words of the parity check matrix at a time to the right by a predetermined number of positions to receive and process a next set of multiple code words of the parity check matrix.

17. The LDPC decoding circuit of claim 11, wherein the CNU processor further comprises a minimum data generator unit configured to identify first and second minimum values corresponding to each of the first and second rows, wherein the first and second minimum values corresponding to each of the first and second rows comprise the intermediate results, wherein the matrix processing system is further configured to store the first and second minimum values for each row as the CNU processor updates a memory for each column of the parity check matrix, and wherein the VNU processor is further configured to process the stored first and second minimum values corresponding to a row previously completed by the CNU processor.

18. A method of operation of a low-density parity check (LDPC) decoder, comprising:
    simultaneously processing, by a circular shifter, multiple code words of a parity check matrix configured for different wireless communication standards, including:
        performing a cyclic shift operation of the multiple code words to align with one or more requisite check nodes;
    processing, by excess hardware of the LDPC decoder constructed and arranged for a larger matrix than the parity check matrix, the multiple code words, including:
        decoding the multiple code words of the parity check matrix for output to the one or more requisite check nodes;
    performing, by the one or more requisite check nodes, at least one first calculation on the decoded multiple code words to obtain intermediate results;
    storing the intermediate results corresponding to two or more rows of the parity check matrix including the multiple code words; and
    processing, by a variable node updating (VNU) processor, the parity check matrix based on the stored intermediate results corresponding to the two or more rows.

19. The method of claim 18, wherein performing the cyclic shift operation includes:
    shifting one row of the intermediate results corresponding to the multiple code words at a time;
    storing the intermediate results corresponding to the two or more rows; and
    processing, by the VNU processor, a sub-matrix of the parity check matrix based on the stored intermediate results corresponding to the two or more rows.

20. The method of claim 19, wherein the circular shifter shifts the multiple code words at a same time to the right by a predetermined number of positions to receive and process a next set of multiple code words of the parity check matrix.

* * * * *